US009324646B2

(12) United States Patent
Fernando et al.

(10) Patent No.: US 9,324,646 B2
(45) Date of Patent: Apr. 26, 2016

(54) OPEN SOURCE POWER QUAD FLAT NO-LEAD (PQFN) PACKAGE

(71) Applicant: International Rectifier Corporation, El Segundo, CA (US)

(72) Inventors: Dean Fernando, Torrance, CA (US); Roel Barbosa, Sta. Rosa Laguna (PH); Toshio Takahashi, Rancho Palos Verdes, CA (US)

(73) Assignee: Infineon Technologies America Corp., El Segundo, CA (US)

( * ) Notice: Subject to any disclaimer, the term of this patent is extended or adjusted under 35 U.S.C. 154(b) by 155 days.

(21) Appl. No.: 14/102,379

(22) Filed: Dec. 10, 2013

(65) Prior Publication Data
US 2014/0097498 A1 Apr. 10, 2014

Related U.S. Application Data

(63) Continuation-in-part of application No. 13/662,244, filed on Oct. 26, 2012, which is a continuation of application No. 13/034,519, filed on Feb. 24, 2011, now Pat. No. 8,587,101.

(60) Provisional application No. 61/459,527, filed on Dec. 13, 2010, provisional application No. 61/774,535, filed on Mar. 7, 2013.

(51) Int. Cl.
*H01L 23/495* (2006.01)
*H01L 27/088* (2006.01)
(Continued)

(52) U.S. Cl.
CPC ...... *H01L 23/49575* (2013.01); *H01L 23/4952* (2013.01); *H01L 23/49513* (2013.01);
(Continued)

(58) Field of Classification Search
CPC .................. H01L 23/49575; H01L 27/088
See application file for complete search history.

(56) References Cited

U.S. PATENT DOCUMENTS 5,773,883 A 6/1998 Majumdar
5,998,856 A 12/1999 Noda
(Continued)

FOREIGN PATENT DOCUMENTS

CN 102569241 7/2012
EP 2 463 904 6/2012
(Continued)

OTHER PUBLICATIONS

U.S. Appl. No. 61/459,527, filed Dec. 13, 2010, Fernando.
(Continued)

*Primary Examiner* — Peniel M Gumedzoe
(74) *Attorney, Agent, or Firm* — Farjami & Farjami LLP (57) ABSTRACT

According to an exemplary implementation, a power quad flat no-lead (PQFN) leadframe includes U-phase, V-phase, and W-phase power switches situated on the PQFN leadframe. A drain of the U-phase power switch is connected to a U-phase output strip of the PQFN leadframe. A source of the U-phase power switch is connected to a U-phase current sense terminal. The U-phase output strip can substantially traverse across the PQFN leadframe. Another U-phase power switch is situated on the PQFN leadframe with a source of the another U-phase power switch connected to the U-phase output strip of the PQFN leadframe. The PQFN leadframe can include a leadframe island within the U-phase output strip. At least one wirebond may be connected to the U-phase output strip.

19 Claims, 6 Drawing Sheets

(Top View)

(Bottom View)

(51) Int. Cl.
*H01L 23/31* (2006.01)
*H01L 23/00* (2006.01)

(52) U.S. Cl.
CPC .... *H01L23/49541* (2013.01); *H01L 23/49548* (2013.01); *H01L 23/49562* (2013.01); *H01L 27/088* (2013.01); *H01L 23/3107* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/2929* (2013.01); *H01L 2224/29101* (2013.01); *H01L 2224/29339* (2013.01); *H01L 2224/32245* (2013.01); *H01L 2224/45015* (2013.01); *H01L 2224/45144* (2013.01); *H01L 2224/45147* (2013.01); *H01L 2224/48091* (2013.01); *H01L 2224/48137* (2013.01); *H01L 2224/48247* (2013.01); *H01L 2224/4903* (2013.01); *H01L 2224/49113* (2013.01); *H01L 2224/49171* (2013.01); *H01L 2224/73265* (2013.01); *H01L 2924/014* (2013.01); *H01L 2924/01005* (2013.01); *H01L 2924/0105* (2013.01); *H01L 2924/01006* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/1305* (2013.01); *H01L 2924/13055* (2013.01); *H01L 2924/13064* (2013.01); *H01L 2924/13091* (2013.01); *H01L 2924/3011* (2013.01); *H01L 2924/30111* (2013.01)

(56) References Cited

U.S. PATENT DOCUMENTS

| | | |
|---|---|---|
| 6,211,549 B1 | 4/2001 | Funaki |
| 6,249,024 B1 | 6/2001 | Mangtani |
| 6,313,598 B1 | 11/2001 | Tamba |
| 6,465,875 B2 | 10/2002 | Connah |
| 6,610,923 B1 | 8/2003 | Nagashima |
| 8,803,499 B2 | 8/2014 | Sreenivas |
| 2001/0045627 A1 | 11/2001 | Connah |
| 2002/0109211 A1 | 8/2002 | Shinohara |
| 2002/0113617 A1 | 8/2002 | Gergintschw |
| 2003/0006434 A1 | 1/2003 | Kawafuji |
| 2003/0107120 A1 | 6/2003 | Connah |
| 2004/0135248 A1 | 7/2004 | Takagawa |
| 2004/0196678 A1 | 10/2004 | Yoshimura |
| 2004/0227476 A1 | 11/2004 | Guerra |
| 2004/0227547 A1 | 11/2004 | Shiraishi |
| 2005/0054186 A1 | 3/2005 | Kim |
| 2006/0001318 A1 | 1/2006 | Ahmad |
| 2006/0043545 A1 | 3/2006 | Yea |
| 2006/0113664 A1 | 6/2006 | Shiraishi |
| 2006/0240599 A1 | 10/2006 | Amano |
| 2007/0064370 A1 | 3/2007 | Kajiwara |
| 2007/0126092 A1 | 6/2007 | San Antonio |
| 2007/0200537 A1 | 8/2007 | Akiyama |
| 2007/0216011 A1 | 9/2007 | Otremba |
| 2007/0228534 A1 | 10/2007 | Uno |
| 2008/0002445 A1 | 1/2008 | Cho |
| 2008/0023831 A1 | 1/2008 | Nishimura |
| 2008/0150436 A1 | 6/2008 | Suzuki |
| 2008/0217662 A1 | 9/2008 | Harnden |
| 2008/0224323 A1 | 9/2008 | Otremba |
| 2008/0252372 A1 | 10/2008 | Williams |
| 2009/0095979 A1* | 4/2009 | Saito ............ H01L 25/18 257/177 |
| 2009/0212733 A1 | 8/2009 | Hsieh |
| 2009/0262468 A1 | 10/2009 | Ide |
| 2009/0321927 A1 | 12/2009 | Nishimura |
| 2010/0127683 A1 | 5/2010 | Uno |
| 2010/0148590 A1 | 6/2010 | Kojima |
| 2010/0164419 A1 | 7/2010 | Suh |
| 2010/0165681 A1 | 7/2010 | Sakano |
| 2010/0301464 A1 | 12/2010 | Arshad |
| 2011/0049685 A1 | 3/2011 | Park |
| 2011/0110011 A1 | 5/2011 | Dittfeld |
| 2011/0169102 A1 | 7/2011 | Uno |
| 2011/0254143 A1* | 10/2011 | Chen ............ H01L 23/4952 257/676 |
| 2012/0126378 A1 | 5/2012 | San Antonio |
| 2012/0267750 A1 | 10/2012 | Imai et al. |
| 2012/0273892 A1 | 11/2012 | Uno |
| 2013/0155745 A1 | 6/2013 | Tanaka |

FOREIGN PATENT DOCUMENTS

| | | |
|---|---|---|
| JP | H 9-102580 | 4/1997 |
| JP | 3384399 | 3/2003 |
| JP | 2004147401 | 5/2004 |
| JP | 2005183463 | 7/2005 |
| JP | 2005183463 A | 7/2005 |
| JP | 2009-27090 | 2/2009 |
| JP | 2011-29262 | 2/2011 |
| JP | 2012129489 | 7/2012 |
| JP | 2012-175070 | 9/2012 |
| TW | 201240046 | 10/2012 |
| WO | WO 98/24128 | 6/1998 |

OTHER PUBLICATIONS

U.S. Appl. No. 61/774,484, filed Mar. 7, 2013, Fernando.
U.S. Appl. No. 61/774,506, filed Mar. 7, 2013, Fernando.
U.S. Appl. No. 61/774,535, filed Mar. 7, 2013, Fernando.
U.S. Appl. No. 61/774,541, filed Mar. 7, 2013, Fernando.
U.S. Appl. No. 61/777,341, filed Mar. 12, 2013, Fernando.
U.S. Appl. No. 61/777,753, filed Mar. 12, 2013, Fernando.
U.S. Appl. No. 61/780,069, filed Mar. 13, 2013, Fernando.
U.S. Appl. No. 61/780,417, filed Mar. 13, 2013, Fernando.
U.S. Appl. No. 61/782,460, filed Mar. 14, 2013, Fernando.
U.S. Appl. No. 13/034,519, filed Feb. 24, 2011, Fernando.
U.S. Appl. No. 13/662,244, filed Oct. 26, 2012, Fernando.
U.S. Appl. No. 14/076,467, filed Nov. 11, 2013, Fernando.
U.S. Appl. No. 14/102,275, filed Dec. 10, 2013, Fernando.
U.S. Appl. No. 14/102,316, filed Dec. 10, 2013, Fernando.
U.S. Appl. No. 14/140,285, filed Dec. 24, 2013, Fernando.
U.S. Appl. No. 14/147,464, filed Jan. 3, 2014, Fernando.
U.S. Appl. No. 14/150,469, filed Jan. 8, 2014, Fernando.
U.S. Appl. No. 14/152,640, filed Jan. 10, 2014, Fernando.
U.S. Appl. No. 14/152,723, filed Jan. 10, 2014, Fernando.
U.S. Appl. No. 14/152,816, filed Jan. 10, 2014, Fernando.

* cited by examiner

(Top View)

Fig. 2B

(Top View)

Fig. 2C (Bottom View)

Fig. 2D

OPEN SOURCE POWER QUAD FLAT NO-LEAD (PQFN) PACKAGE

The present application claims the benefit of and priority to provisional application Ser. No. 61/774,535, filed on Mar. 7, 2013, and entitled "Open Source Power Quad Flat No-Lead (PQFN) Leadframe." The present application is also a continuation-in-part of application Ser. No. 13/662,244 filed on Oct. 26, 2012, and entitled "Compact Wirebonded Power Quad Flat No-Lead (PQFN) Package," which in turn claims priority to application Ser. No. 13/034,519 filed on Feb. 24, 2011, and entitled "Multi-Chip Module (MCM) Power Quad Flat No-Lead (PQFN) Semiconductor Package Utilizing a Leadframe for Electrical Interconnections," which in turn claims priority to provisional application Ser. No. 61/459,527 filed on Dec. 13, 2010, and entitled "Low Cost Leadframe Based High Power Density Full Bridge Power Device." The present application claims the benefit of and priority to all of the above-identified applications. Moreover, the disclosure and contents of all of the above-identified applications are hereby incorporated fully by reference into the present application.

BACKGROUND

I. Definition

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

II. Background Art

Packages combining several semiconductor devices can simplify circuit design, reduce costs, and provide greater efficiency and improved performance by keeping related and dependent circuit components in close proximity. Furthermore, these packages can facilitate application integration and greater electrical and thermal performance compared to using separate packaging for components.

Quad flat no-lead (QFN) packages are leadless packages for electrical components, such as power semiconductor devices. The QFN packages can utilize a leadframe and wirebonds for connection to the electrical components housed therein. The QFN packages often have limited complexity and electrical routing can be challenging, particularly for more complex configurations. Thus, QFN packages often have simple configurations and house a small number of electrical components.

SUMMARY

An open source power quad flat no-lead (PQFN) leadframe, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
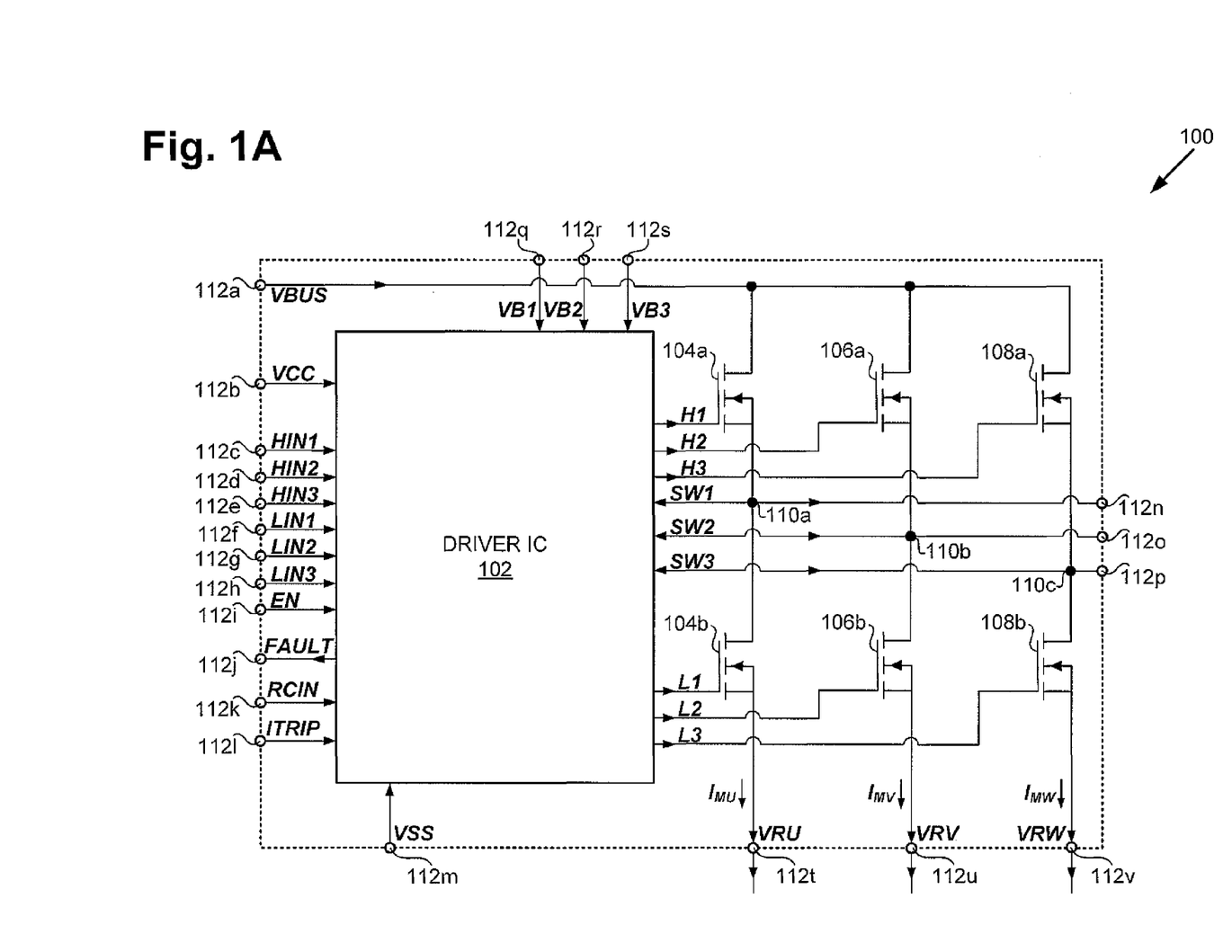
FIG. 1A illustrates a schematic diagram of a circuit of an exemplary power quad flat no-lead (PQFN) package.
Figure 1B:
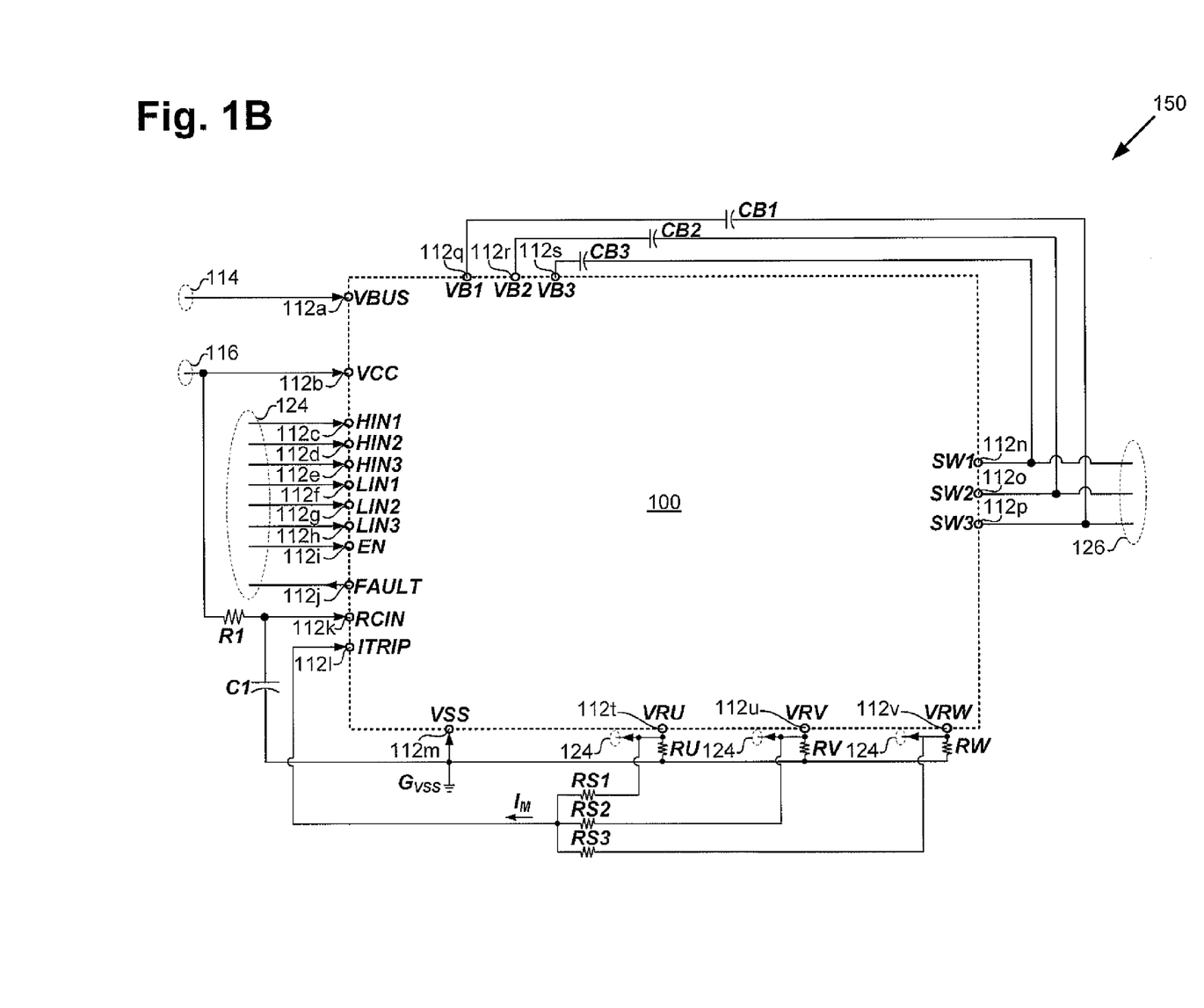
FIG. 1B illustrates a schematic diagram of an exemplary PQFN package in a multi-phase power inverter circuit.

FIG. 1A illustrates a schematic diagram of a circuit of power quad flat no-lead (PQFN) package 100. FIG. 1B illustrates a schematic diagram of PQFN package 100 in multi-phase power inverter circuit 150.

Referring to FIGS. 1A and 1B, PQFN package 100 includes driver integrated circuit (IC) 102, U-phase power switches 104*a* and 104*b*, V-phase power switches 106*a* and 106*b*, and W-phase power switches 108*a* and 108*b*.

In multi-phase power inverter circuit 150 of FIG. 1B, PQFN package 100 is connected to bus voltage source 114, supply voltage source 116, microcontroller 124, motor 126, resistors R1, RS1, RS2, RS3, RU, RV, and RW, capacitor C1, and bootstrap capacitors CB1, CB2, and CB3.

Any of PQFN package 100, microcontroller 124, motor 126, resistors R1, RS1, RS2, RS3, RU, RV, and RW, capacitor C1, and bootstrap capacitors CB1, CB2, and CB3 can be mounted on a printed circuit board (PCB). Furthermore, PQFN package 100 can be connected to any of bus voltage source 114, supply voltage source 116, microcontroller 124, motor 126, resistors R1, RS1, RS2, RS3, RU, RV, and RW, capacitor C1, and bootstrap capacitors CB1, CB2, and CB3 through conductive leads on the PCB.

PQFN package 100 also includes VBUS terminal 112a, VCC terminal 112b, HIN1 terminal 112c, HIN2 terminal 112d, HIN3 terminal 112e, LIN1 terminal 112f, LIN2 terminal 112g, LIN3 terminal 112h, EN terminal 112i, FAULT terminal 112j, RCIN terminal 112k, ITRIP terminal 112l, VSS terminal 112m, SW1 terminal 112n, SW2 terminal 112o, SW3 terminal 112p, VB1 terminal 112q, VB2 terminal 112r, and VB3 terminal 112s, VRU terminal 112t (also referred to as "U-phase current sense terminal 112t"), VRV terminal 112u (also referred to as "V-phase current sense terminal 112u"), and VRW terminal 112v (also referred to as "W-phase current sense terminal 112v"), which are collectively referred to as I/O terminals 112.

In PQFN package 100, VBUS terminal 112a receives VBUS as input from bus voltage source 114. VCC terminal 112b receives VCC as input to driver IC 102 from supply voltage source 116. HIN1 terminal 112c, HIN2 terminal 112d, and HIN3 terminal 112e receive HIN1, HIN2, and HIN3 respectively as inputs to driver IC 102 from microcontroller 124. LIN1 terminal 112f, LIN2 terminal 112g, and LIN3 terminal 112h receive LIN1, LIN2, and LIN3 respectively as inputs to driver IC 102 from microcontroller 124. EN terminal 112i receives EN as input to driver IC 102 from microcontroller 124. FAULT terminal 112j receives FAULT as output from driver IC 102 to microcontroller 124. RCIN terminal 112k receives RCIN as input to driver IC 102 from resistor R1 and capacitor C1. ITRIP terminal 112l receives ITRIP as input to driver IC 102 from U-phase power switch 104b, V-phase power switch 106b, and W-phase power switch 108b. VSS terminal 112m receives VSS as input to driver IC 102 from ground $G_{VSS}$. SW1 terminal 112n receives SW1 from U-phase output node 110a as output to motor 126. Driver IC 102 also receives SW1 as input from U-phase output node 110a. SW2 terminal 112o receives SW2 from V-phase output node 110b as output to motor 126. Driver IC 102 also receives SW2 as input from V-phase output node 110b. SW3 terminal 112p receives SW3 from W-phase output node 110c as output to motor 126. Driver IC 102 also receives SW3 as input from W-phase output node 110e. VB1 terminal 112q receives VB1 as input to driver IC 102 from bootstrap capacitor CB1. VB2 terminal 112r receives VB2 as input to driver IC 102 from bootstrap capacitor CB2. VB3 terminal 112s receives VB3 as input to driver IC 102 from bootstrap capacitor CB3. VRU terminal 112t receives U-phase motor current $I_{MU}$ as output from U-phase power switch 104b to microcontroller 124. VRV terminal 112u receives V-phase motor current $I_{MV}$ as output from V-phase power switch 106b to microcontroller 124. VRW terminal 112v receives W-phase motor current $I_{MW}$ as output from W-phase power switch 108b to microcontroller 124.

It will be appreciated that in various implementations, the number, quantity, and location of I/O terminals 112 are different than what is shown. For example, in various implementations, a driver IC that is different than driver IC 102 can be utilized, which can have different capabilities and/or I/O requirements than driver IC 102. This may be reflected in I/O terminals 112 as well as other connections of PQFN package 100.

In PQFN package 100, driver IC 102 can be a high voltage IC(HVIC) for driving U-phase power switches 104a and 104b, V-phase power switches 106a and 106b, and W-phase power switches 108a and 108b, which are in a full bridge configuration. Examples of driver IC 102 include "5$^{th}$ generation" HVICs available from International Rectifier Corporation®. In the present implementation, U-phase power switches 104a and 104b, V-phase power switches 106a and 106b, and W-phase power switches 108a and 108b are vertical conduction power devices, for example, group IV semiconductor power metal-oxide-semiconductor field effect transistors (power MOSFETs) such as fast-reverse epitaxial diode field effect transistors (FREDFETs), or group IV semiconductor insulated-gate bipolar transistors (IGBTs). In other implementations group III-V semiconductor FETs, HEMTs (high electron mobility transistors) and, in particular, GaN FETs and/or HEMTs can be used as power devices in U-phase power switches 104a and 104b, V-phase power switches 106a and 106b, and W-phase power switches 108a and 108b. As defined above, Gallium nitride or GaN, as used herein, refers to a Ill-Nitride compound semiconductor wherein the group III element or elements include some or a substantial amount of gallium, but may also include other group III elements in addition to gallium. As previously stated, a group III-V or a GaN transistor may also refer to a composite high voltage enhancement mode transistor that is formed by connecting the group III-V or the GaN transistor in cascode with a lower voltage group IV transistor. While PQFN package 100 is in a full bridge configuration, alternative implementations can provide other package configurations as required by the particular application.

In PQFN package 100, HIN$^1$, HIN$^2$, and HIN3 are control signals for U-phase power switch 104a, V-phase power switch 106a, and W-phase power switch 108a, which are high side transistors. Driver IC 102 receives HIN1, HIN2, and HIN3, which are then level shifted and respectively provided to U-phase power switch 104a, V-phase power switch 106a, and W-phase power switch 108a as high side gate signals H1, H2, and H3. Driver IC 102 thereby generates high side gate signals H1, H2, and H3 from HIN1, HIN2, and HIN3 respectively. Driver IC 102 further receives SW1, SW2, and SW3 from U-phase output node 110a, V-phase output node 110b, and W-phase output node 110c respectively.

Similarly, LIN1, LIN2, and LIN3 are control signals for U-phase power switch 104b, V-phase power switch 106b, and W-phase power switch 108b, which are low side transistors. Driver IC 102 receives LIN1, LIN2, and LIN3, which are then respectively provided to U-phase power switch 104b, V-phase power switch 106b, and W-phase power switch 108b as low side gate signals L1, L2, and L3. Driver IC 102 thereby generates low side gate signals L1, L2, and L3 from LIN1, LIN2, and LIN3 respectively. Switching in driver IC 102 may be altered using EN. EN can be used, by microcontroller 124, to enable switching of driver IC 102. More particularly, driver IC 102 is configured to enable switching of H1, H2, H3, L1, L2, and L3 responsive to EN.

Driver IC 102 drives switching of U-phase power switches 104a and 104b, V-phase power switches 106a and 106b, and W-phase power switches 108a and 108b, which generates U-phase motor current $I_{MU}$, V-phase motor current $I_{MV}$, and W-phase motor current $I_{MW}$. In the present implementation, driver IC 102 is impedance matched to respective ones of U-phase power switches 104a and 104b, V-phase power switches 106a and 106b, and W-phase power switches 108a and 108b. Driver IC 102 can thereby drive U-phase power switches 104a and 104b, V-phase power switches 106a and 106b, and W-phase power switches 108a and 108b without gate resistors which allows PQFN package 100 to be smaller.

VBUS is a bus voltage from bus voltage source 114, which is coupled to respective drains of U-phase power switch 104a, V-phase power switch 106a, and W-phase power switch 108a. As one example, bus voltage source 114 can be an AC to DC rectifier. The AC can be, as one example, an outlet voltage, such as 230 volts. The DC voltage can be, for example, approximately 300 volts to approximately 400 volts for VBUS.

VCC is a supply voltage for driver IC 102 from supply voltage source 116, which can be, for example, approximately 15 volts. As shown in FIG. 1A, driver IC 102 is powered by VCC. In some implementations, supply voltage source 116 generates VCC from VBUS. VB1, VB2, and VB3 are bootstrap voltages for driver IC 102 and are provided by bootstrap capacitors CB1, CB2, and CB3 respectively. Bootstrap capacitors CB1, CB2, and CB3 can be charged, for example, by VCC through bootstrap diodes in driver IC 102. Bootstrap capacitor CB1 is coupled between VB1 terminal 112q and SW3 terminal 112p. Bootstrap capacitor CB2 is coupled between VB2 terminal 112r and SW2 terminal 112o. Bootstrap capacitor CB3 is coupled between VB3 terminal 112s and SW1 terminal 112n.

FIG. 1A shows U-phase motor current $I_{MU}$, V-phase motor current $I_{MV}$, and W-phase motor current $I_{MW}$ provided to driver IC 102 as ITRIP. In the present implementation, resistors RS1, RS2, and RS3 combine U-phase motor current $I_{MU}$, V-phase motor current $I_{MV}$, and W-phase motor current $I_{MW}$ into motor current $I_M$. Resistors RS1, RS2, and RS3 are merely exemplary means of combining U-phase motor current $I_{MU}$, V-phase motor current $I_{MV}$, and W-phase motor current $I_{MW}$. In some implementations, one or more op amps are used to sum U-phase motor current $I_{MU}$, V-phase motor current $I_{MV}$, and W-phase motor current $I_{MW}$. Furthermore, U-phase motor current $I_{MU}$, V-phase motor current $I_{MV}$, and W-phase motor current $I_{MW}$ may be provided to driver IC 102 unsummed.

Driver IC 102 utilizes ITRIP for overcurrent protection. For example, ITRIP is compared to a reference value. If ITRIP exceeds the reference value, driver IC 102 detects an overcurrent condition. Furthermore, driver IC 102 indicates the overcurrent condition to microcontroller 124 by providing FAULT to FAULT terminal 112j. Driver IC 102 utilizes RCIN to automatically reset from the overcurrent protection. As shown in FIG. 1B, resistor R1 is coupled between VCC terminal 112b and RCIN terminal 112k to charge capacitor C1. Capacitor C1 is coupled between RCIN terminal 112k and VSS terminal 112m. Resistor R1 and capacitor C1 can be changed to alter timing of automatic reset for the overcurrent protection.

Driver IC 102, U-phase power switches 104a and 104b, V-phase power switches 106a and 106b, and W-phase power switches 108a and 108b are coupled to ground $G_{VSS}$. Driver IC 102 is coupled to ground $G_{VSS}$ through VSS terminal 112m. U-phase power switch 104a is coupled to ground $G_{VSS}$ through VRU terminal 112t and resistor VRU, which is connected to VRU terminal 112t. V-phase power switch 106a is coupled to ground $G_{VSS}$ through VRV terminal 112u and resistor VRV, which is connected to VRV terminal 112u. W-phase power switch 108a is coupled to ground $G_{VSS}$ through VRW terminal 112v and resistor VRW, which is connected to VRW terminal 112v.

In some implementations, microcontroller 124 individually receives U-phase motor current $I_{MU}$, V-phase motor current $I_{MV}$, and W-phase motor current $I_{MW}$ and generates HIN1, HIN2, HIN3, LIN1, LIN2, and LIN3 based on U-phase motor current $I_{MU}$, V-phase motor current $I_{MV}$, and W-phase motor current $I_{MW}$. In other implementations, microcontroller 124 receives at least a combined current and generates HIN1, HIN2, HIN3, LIN1, LIN2, and LIN3 based on the combined current. The combined current can comprise at least two of U-phase motor current $I_{MU}$, V-phase motor current $I_{MV}$, and W-phase motor current $I_{MW}$ (e.g. motor current $I_M$ in FIG. 1B) and may be combined externally or internally to PQFN package 100. In implementations where microcontroller 124 receives the combined current, microcontroller 124 may be required to perform phase current reconstruction of U-phase motor current $I_{MU}$, V-phase motor current $I_{MV}$, and W-phase motor current $I_{MW}$ to generate HIN1, HIN2, HIN3, LIN1, LIN2, and LIN3. Advantageously, PQFN package 100 supports each configuration allowing for flexibility in implementing multi-phase power inverter circuit 150.

Thus, PQFN package 100 can be an open source PQFN package (which may also be referred to as an open emitter PQFN package), in which U-phase motor current $I_{MU}$, V-phase motor current $I_{MV}$, and W-phase motor current $I_{MW}$ are provided as respective outputs of VRU terminal 112t, VRV terminal 112u, and VRW terminal 112v. It is noted that, in some implementations, two of U-phase motor current $I_{MU}$, V-phase motor current $I_{MV}$, and W-phase motor current $I_{MW}$ may be combined into a same output terminal with another output terminal being for the remaining one of U-phase motor current $I_{MU}$, V-phase motor current $I_{MV}$, and W-phase motor current $I_{MW}$.

Typical QFN packages have limited complexity with simple configurations and a small number of electrical components. For more complex configurations, it would be difficult to rout wires for connections while avoiding wire crossing and wire shorting. Moreover, long lengths of wiring would adversely affect electrical and thermal performance. However, PQFN packages, in accordance with various implementations of the present disclosure, can be substantially more complex than typical QFN packages while avoiding wire crossing and wire shorting and achieving high electrical and thermal performance. For example, PQFN package 100 can easily accommodate multi-phase multi-phase power inverter circuit 150. Furthermore, PQFN package 100 can accommodate additional complexity introduced by aforementioned open source configurations.

Figure 2A:
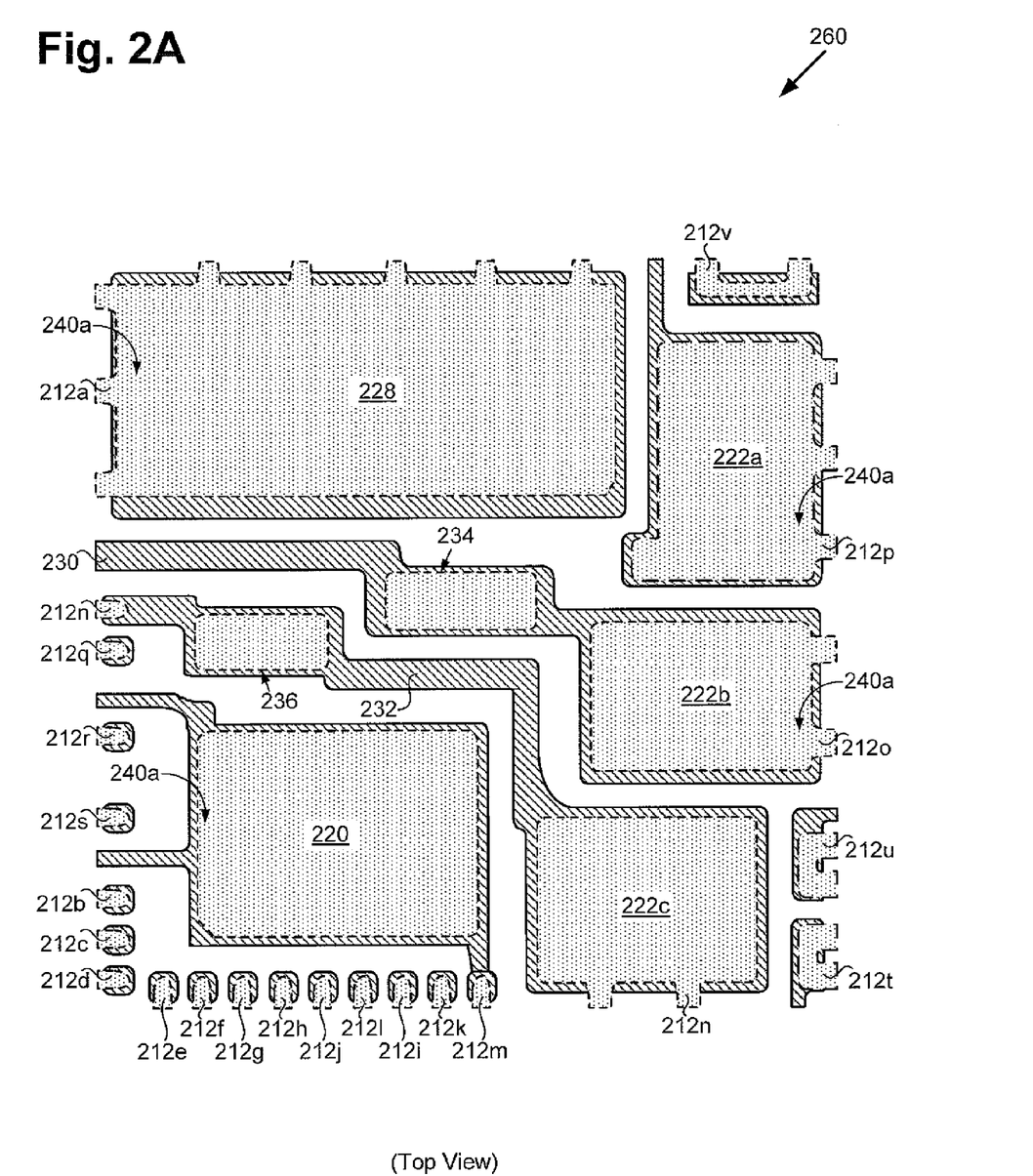
FIG. 2A illustrates a top-plan view of an exemplary PQFN leadframe.
Figure 2B:
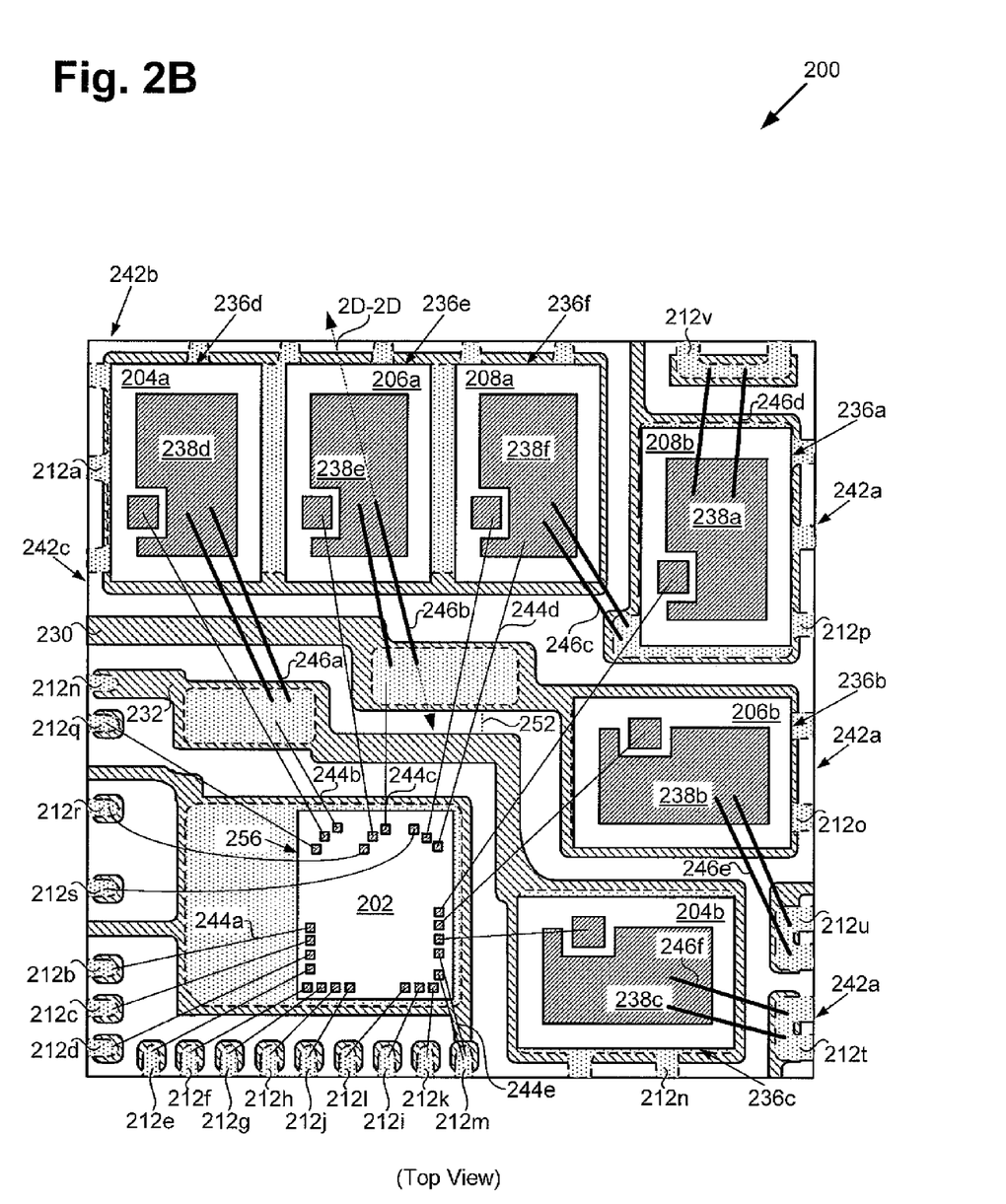
FIG. 2B illustrates a top-plan view of an exemplary PQFN package, which includes a PQFN leadframe.
Figure 2C:
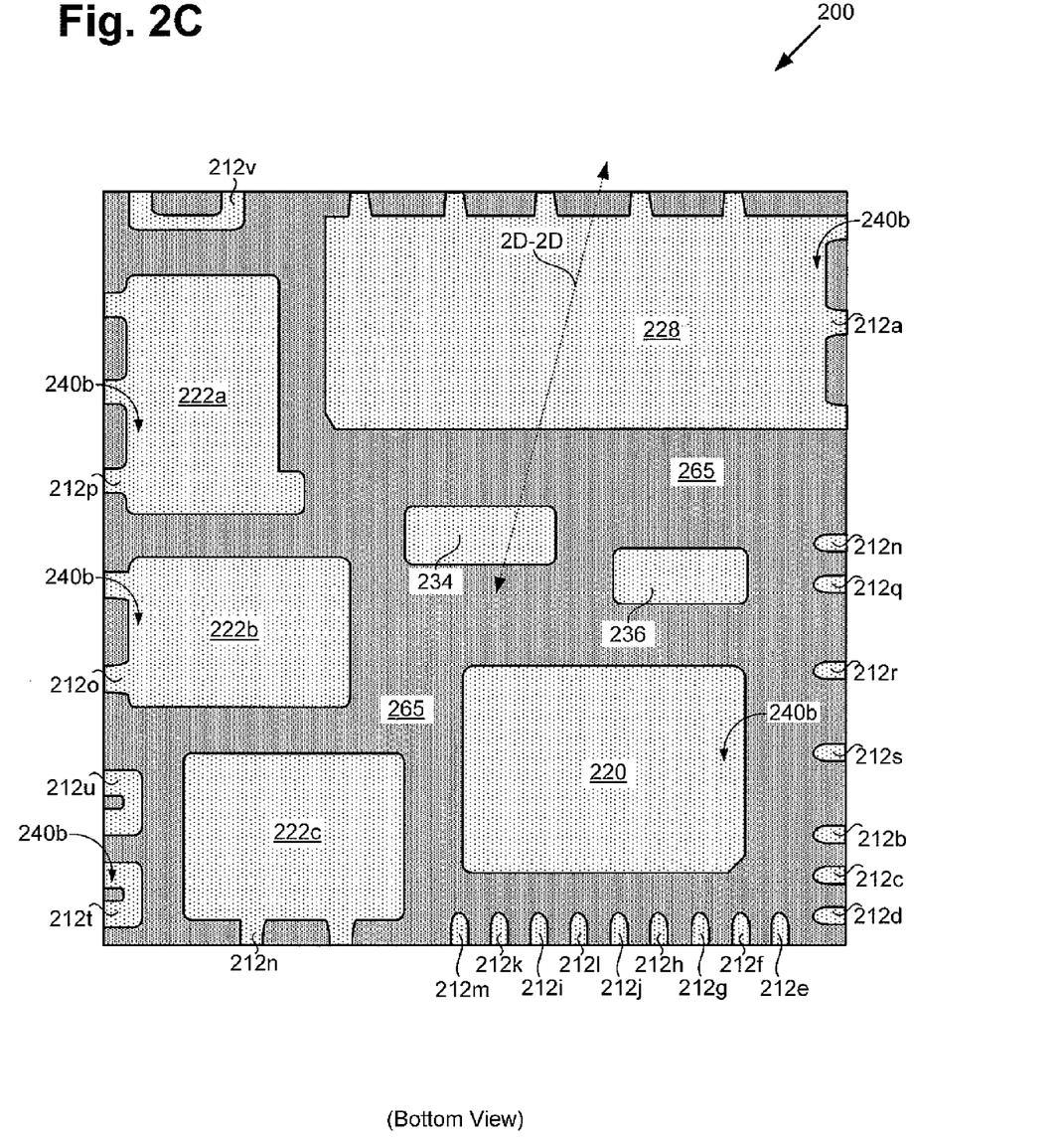
FIG. 2C illustrates a bottom-plan view of an exemplary PQFN package, which includes a PQFN leadframe.
Figure 2D:
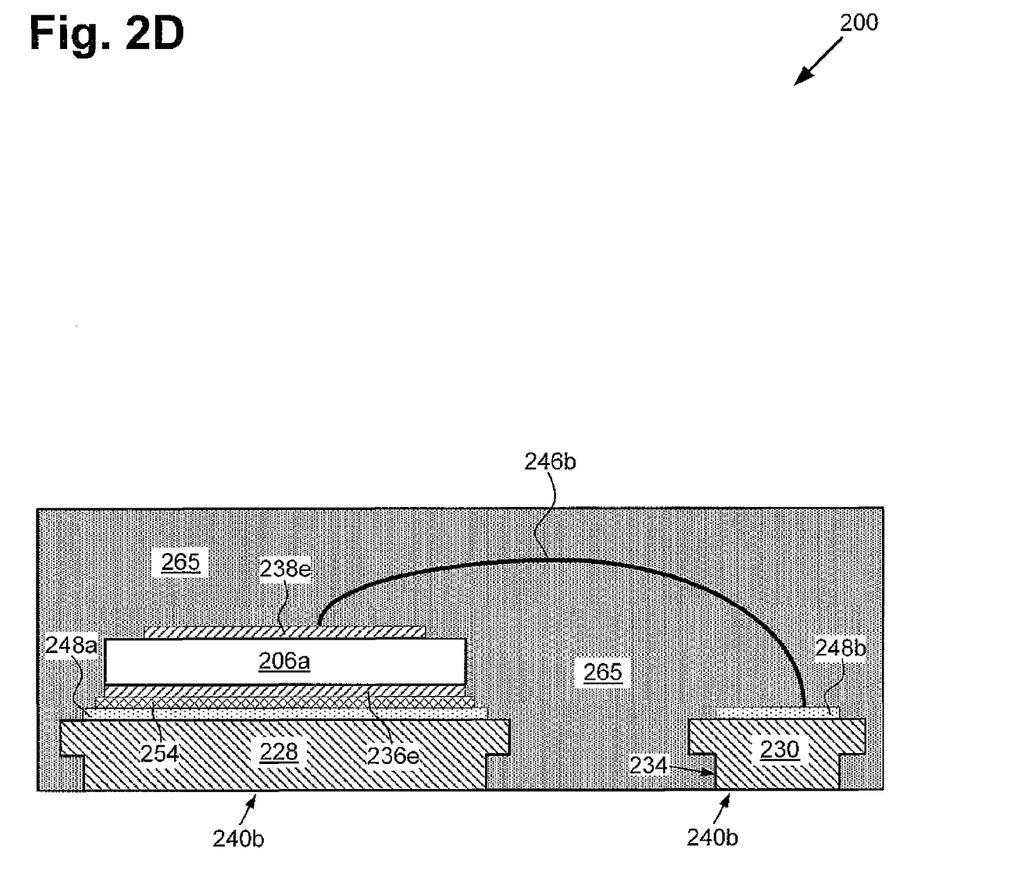
FIG. 2D illustrates a cross sectional view of a portion of an exemplary PQFN package.

Turning to FIGS. 2A, 2B, and 2C, FIG. 2A illustrates a top-plan view of PQFN leadframe 260. FIG. 2B illustrates a top-plan view of PQFN package 200, which includes PQFN leadframe 260. FIG. 2C illustrates a bottom-plan view of PQFN package 200, which includes PQFN leadframe 260. FIG. 2D illustrates a cross sectional view of a portion of PQFN package 200. In the present implementation, PQFN package 200 is a multi-chip module (MCM) PQFN package, which can have a footprint of approximately 12 mm by approximately 12 mm. In other implementations, PQFN package 200 can have a footprint of greater than 12 mm by 12 mm. In still other implementations, PQFN package 200 can have a footprint of less than 12 mm by 12 mm.

PQFN package 200 corresponds to PQFN package 100 in FIGS. 1A and 1B. For example, PQFN package 200 includes driver IC 202, U-phase power switches 204a and 204b, V-phase power switches 206a and 206b, and W-phase power switches 208a and 208b corresponding respectively to driver IC 102, U-phase power switches 104a and 104b, V-phase power switches 106a and 106b, and W-phase power switches 108a and 108b in FIG. 1A.

Furthermore, PQFN package 200 includes VBUS terminal 212a, VCC terminal 212b, HIN1 terminal 212c, HIN2 terminal 212d, HIN3 terminal 212e, LINT terminal 212f, LIN2 terminal 212g, LIN3 terminal 212h, EN terminal 212i, FAULT terminal 212j, RCIN terminal 212k, ITRIP terminal 212*l*, VSS terminal 212*m*, SW1 terminal 212*n*, SW2 terminal 212*o*, SW3 terminal 212*p*, VB1 terminal 212*q*, VB2 terminal 212*r*, VB3 terminal 212*s*, VRU terminal 212*t* (also referred to as "U-phase current sense terminal 212*t*"), VRV terminal 212*u* (also referred to as "V-phase current sense terminal 212*u*"), and VRW terminal 212*v* (also referred to as "W-phase current sense terminal 212*v*"), which are collectively referred to as I/O terminals 212 and correspond respectively to VBUS terminal 112*a*, VCC terminal 112*b*, HIN1 terminal 112*c*, HIN2 terminal 112*d*, HIN3 terminal 112*e*, LINT terminal 112*f*, LIN2 terminal 112*g*, LIN3 terminal 112*h*, EN terminal 112*i*, FAULT terminal 112*j*, RCIN terminal 112*k*, ITRIP terminal 112*l*, VSS terminal 112*m*, SW1 terminal 112*n*, SW2 terminal 112*o*, SW3 terminal 112*p*, VB1 terminal 112*q*, VB2 terminal 112*r*, VB3 terminal 112*s*, VRU terminal 112*t*, VRV terminal 112*u*, and VRW terminal 112*v* in PQFN package 100.

FIG. 2A shows PQFN leadframe 260 including driver IC die pad 220, W-phase die pad 222*a*, V-phase die pad 222*b*, U-phase die pad 222*c*, and common die pad 228. Driver IC die pad 220 is also referred to herein as driver IC pad 220. W-phase die pad 222*a*, V-phase die pad 222*b*, U-phase die pad 222*c*, and common die pad 228 are also referred to herein as W-phase output pad 222*a*, V-phase output pad 222*b*, U-phase output pad 222*c*, and common output pad 228.

PQFN leadframe 260 also includes V-phase and U-phase output strips 230 and 232 and I/O terminals 212. Leadframe island 234 is within V-phase output strip 230 of PQFN leadframe 260 and V-phase output strip 230 is electrically and mechanically connected (e.g. integrally connected) to V-phase output pad 222*b* of PQFN leadframe 260. Leadframe island 236 is within U-phase output strip 232 of PQFN leadframe 260 and U-phase output strip 232 is electrically and mechanically connected (e.g. integrally connected) to U-phase output pad 222*c* of PQFN leadframe 260.

As shown in FIG. 2B, U-phase output strip 232 can optionally substantially traverse across PQFN leadframe 260. Similarly, V-phase output strip 230 can optionally substantially traverse across PQFN leadframe 260. In doing so, any of V-phase and U-phase output strips 230 and 232 can provide, for example, additional I/O terminals for PQFN package 200. For example, in FIG. 2B, U-phase output strip 232 is shown as providing an additional SW1 terminal 212*n* at edge 242*c* of PQFN package 200.

PQFN leadframe 260 can comprise a material with high thermal and electrical conductivity such as copper (Cu) alloy C194 available from Olin Brass®. Top-side 240*a* of PQFN leadframe 260 can be selectively plated with materials for enhanced adhesion to device dies and wires. The plating can comprise silver (Ag) plating that is selectively applied to PQFN leadframe 260, which is available from companies such as QPL Limited.

FIGS. 2A and 2B show that PQFN leadframe 260 is an etched leadframe, such as a half-etched leadframe. Portions of PQFN leadframe 260, which are unetched (e.g. not half-etched) are indicated in FIGS. 2A and 2B using dashed lines. Leadframe islands 234 and 236 are examples of such unetched portions. For example, FIG. 2C shows bottom-side 240*b* of PQFN leadframe 260 (which also corresponds to a bottom-side of PQFN package 200). FIG. 2C further shows mold compound 265 of PQFN package 200, which covers etched portions of PQFN leadframe 260. Mold compound 265 can be a plastic that has a low flexural modulus, such as CEL9220ZHF10 (v79) available from Hitachi® Chemical. To provide resilience against package cracking, the height (or thickness) of PQFN package 200 as defined by mold compound 265 may be kept thin, such as 0.9 mm or less.

Leadframe island 234 and leadframe island 236 are examples of unetched portions of PQFN leadframe 260 and are exposed through mold compound 265 on bottom-side 240*b* of PQFN leadframe 260 (which also corresponds to a bottom-side of PQFN package 200). As such, leadframe island 234 and leadframe island 236 are exposed on bottom-side 240*b* of PQFN leadframe 260 for high electrical conductivity and/or thermal dissipation. By providing a (PCB) with matching lands, this feature can optionally be exploited. The exposed areas of PQFN leadframe 260 can be plated, for example with Tin (Sn).

Driver IC 202, U-phase power switches 204*a* and 204*b*, V-phase power switches 206*a* and 206*b*, and W-phase power switches 208*a* and 208*b* are interconnected utilizing wirebonds and PQFN leadframe 260.

FIG. 2B shows that U-phase power switches 204*a* and 204*b*, V-phase power switches 206*a* and 206*b*, W-phase power switches 208*a* and 208*b*, and driver IC 202 are electrically and mechanically connected to PQFN leadframe 260. This can be accomplished utilizing solder or conductive adhesive, such as silver filled QMI 529HT available from Henkel Corporation.

As shown in FIG. 2B, U-phase power switch 204*b*, V-phase power switch 206*b*, and W-phase power switch 208*b* are situated on PQFN leadframe 260 along edge 242*a* of PQFN package 200. W-phase power switch 208*b* is situated on W-phase output pad 222*a*. More particularly, drain 236*a* of W-phase power switch 208*b* is situated on W-phase output pad 222*a*. Similarly, V-phase power switch 206*b* is situated on V-phase output pad 222*b*. More particularly, drain 236*b* of V-phase power switch 206*b* is situated on V-phase output pad 222*b*. Also, U-phase power switch 204*b* is situated on U-phase output pad 222*c*. More particularly, drain 236*c* of U-phase power switch 204*b* is situated on U-phase output pad 222*c*. Thus, U-phase power switch 204*b*, V-phase power switch 206*b*, and W-phase power switch 208*b* are individually coupled to respective die pads of PQFN leadframe 260. As such, W-phase output pad 222*a* can correspond to W-phase output terminal 212*p* of PQFN package 200, V-phase output pad 222*b* can correspond to V-phase output terminal 212*o* of PQFN package 200, and U-phase output pad 222*c* can correspond to U-phase output terminal 212*n* of PQFN package 200, as shown in FIG. 2B.

Also shown in FIG. 2B, U-phase power switch 204*a*, V-phase power switch 206*a*, and W-phase power switch 208*a* are situated on PQFN leadframe 260 along edge 242*b* of PQFN package 200, which intersects edge 242*a*. U-phase power switch 204*a*, V-phase power switch 206*a*, and W-phase power switch 208*a* are situated on common output pad 228. More particularly, drain 236*d* of U-phase power switch 204*a*, drain 236*e* of V-phase power switch 206*a*, and drain 236*f* of W-phase power switch 208*a* are situated on common output pad 228 of PQFN leadframe 260. Thus, common output pad 228 can correspond to VBUS terminal 212*a* (e.g. a bus voltage input terminal) of PQFN package 200, as shown in FIG. 2B.

An example of this configuration is shown in more detail in FIG. 2D. FIG. 2D illustrates a cross sectional view of a portion of PQFN package 200. The cross sectional view in FIG. 2D corresponds to cross section 2D-2D, of FIGS. 2B and 2C. FIG. 2D shows drain 236*e* of V-phase power switch 206*a* connected to common output pad 228 through conductive adhesive 254 and plating 248*a* of PQFN leadframe 260. Conductive adhesive 254 can include silver filled adhesive such as QMI 529HT. Other dies in PQFN package 200 can similarly be connected to PQFN leadframe 260.

Driver IC 202 is situated on PQFN leadframe 260. More particularly, driver IC 202 is situated on driver IC pad 220 of PQFN leadframe 260. Driver IC pad 220 is larger than driver IC 202 and can therefore accommodate different, larger driver ICs, which may have different features than driver IC 202.

FIG. 2B also shows that wirebonds, such as wirebond 244a electrically and mechanically connect driver IC 202 to VCC terminal 212b, HIN1 terminal 212c, HIN2 terminal 212d, HIN3 terminal 212e, LIN1 terminal 212f, LIN2 terminal 212g, LIN3 terminal 212h, EN terminal 212i, FAULT terminal 212j, RCIN terminal 212k, ITRIP terminal 212l, VSS terminal 212m, VB1 terminal 212q, VB2 terminal 212r, VB3 terminal 212s, and to respective gates of U-phase power switches 204a and 204b, V-phase power switches 206a and 206b, and W-phase power switches 208a and 208b.

Wirebond 244a and similarly depicted wirebonds in FIG. 2B can include, for example, 1.3 mil diameter G1 type Gold (Au) wires. Thicker wires can be utilized for power connections, such as wirebonds 246a, 246b, 246c, 246d, 246e, and 246f (also referred to as "wirebonds 246"). Wirebonds 246 can be, for example, 2.0 mil diameter copper (Cu) wires, such as Maxsoft® LD wires available from Kulicke & Soffa®. Wirebonds 246 can be bonded using bond stitch on ball (BSOB) bonding. As shown in FIG. 2B, multiple wirebonds, such as two wirebonds, can be in parallel with wirebonds 246 to for additional current handling.

Driver IC 102 is coupled to ground $G_{VSS}$ through VSS terminal 212m. As shown in FIG. 2B, at least one wirebond 244e is coupling driver IC 102 to VSS terminal 212m. In the implementation shown, support logic circuitry and gate drivers of driver IC 102 are coupled to VSS terminal 212m through respective wirebonds, however other configurations can be utilized. Also in the implementation shown, VSS terminal 212m is connected to driver IC pad 220. Driver IC 202 can optionally have ground 256, which is situated on driver IC pad 220 of PQFN leadframe 260 and may thereby be coupled to ground $G_{VSS}$.

U-phase power switch 204b, V-phase power switch 206b, and W-phase power switch 208b are coupled respectively to U-phase power switch 204a, V-phase power switch 206a, and W-phase power switch 208a through PQFN leadframe 260.

In FIG. 2B, wirebond 246a electrically and mechanically connects source 238d of U-phase power switch 204a to PQFN leadframe 260. More particularly, source 238d of U-phase power switch 238c is connected via at least wirebond 246a to leadframe island 236 of U-phase output strip 232. Drain 236c of U-phase power switch 238c is connected to U-phase output strip 232 of PQFN leadframe 260. Thus, U-phase output node 110a of FIG. 1A is situated on U-phase output strip 232 of PQFN leadframe 260, where U-phase output strip 232 is connected to U-phase output pad 222c of PQFN leadframe 260.

PQFN package 200 has significant flexibility in arranging wirebond 246a, and other wirebonds, such as wirebond 244b, which are connected to U-phase output strip 232, while avoiding wire shorts due to wire crossing and achieving high electrical and thermal performance. Thus, PQFN package can accommodate, source 238c of U-phase power switch 204b being connected to U-phase current sense terminal 212t, even where PQFN package 200 has a small footprint. More particularly, in the implementation shown, at least one wirebond 246f is connecting source 238c of U-phase power switch 204b to U-phase current sense terminal 212t. PQFN package 200 thereby provides source 238c for external connection.

At least wirebond 244b electrically and mechanically connects driver IC 202 and U-phase output strip 232 of PQFN leadframe 260 at leadframe island 236 to provide SW1 to driver IC 202 as shown in FIG. 1A. U-phase output node 110a of FIG. 1A is also situated on leadframe island 236 of PQFN leadframe 260. As leadframe island 236 is exposed on bottom-side 240b of PQFN package 200 (shown in FIG. 2C), heat generated at U-phase output node 110a can be effectively dissipated from PQFN package 200.

Also in PQFN package 200, wirebond 246b electrically and mechanically connects source 238e of V-phase power switch 206a to PQFN leadframe 260. FIG. 2D illustrates one example of this connection. Source 238e of V-phase power switch 206a is connected via at least wirebond 246b to leadframe island 234 of V-phase output strip 230 through plating 248b of PQFN leadframe 260. V-phase output strip 230 then connects to drain 236b of V-phase power switch 206b through V-phase output pad 222b of PQFN leadframe 260. A similar connection can be employed for connecting source 238d to drain 236c of U-phase power switch 204b. At least wirebond 246b electrically and mechanically connects source 238e of V-phase power switch 206a to V-phase output strip 230 at leadframe island 234. Thus, V-phase output node 110b of FIG. 1A is situated on V-phase output strip 230 of PQFN leadframe 260, where V-phase output strip 230 is connected to V-phase output pad 222b of PQFN leadframe 260.

PQFN package 200 has significant flexibility in arranging wirebond 246b, and other wirebonds, such as wirebond 244c, which are connected to V-phase output strip 230, while avoiding wire shorts due to wire crossing and achieving high electrical and thermal performance. Thus, PQFN package can accommodate, source 238b of V-phase power switch 206b being connected to V-phase current sense terminal 212u, even where PQFN package 200 has a small footprint. More particularly, in the implementation shown, at least one wirebond 246e is connecting source 238b of V-phase power switch 206b to V-phase current sense terminal 212u. PQFN package 200 thereby provides source 238b for external connection.

At least wirebond 244c electrically and mechanically connects driver IC 202 and V-phase output strip 230 of PQFN leadframe 260 at leadframe island 234 to provide SW2 to driver IC 202 as shown in FIG. 1A. V-phase output node 110b of FIG. 1A is also situated on leadframe island 234 of PQFN leadframe 260. As leadframe island 234 is exposed on bottom-side 240b of PQFN package 200 (shown in FIG. 2C), heat generated at V-phase output node 110b can be effectively dissipated from PQFN package 200.

It is noted that PQFN package 200 can include leadframe islands 234 and/or 236 without V-phase output strip 230 and/or 232. For example, leadframe island 234 can be connected to V-phase output pad 222b through a trace on a PCB. It is further noted that PQFN package 200 can include V-phase output strip 230 and/or 232 without leadframe islands 234 and/or 236. However, having V-phase and U-phase output strips 230 and 232 with leadframe islands 234 and 236 can offer significant flexibility in arranging wirebonds in PQFN package 200 while achieving high electrical and thermal performance.

In FIG. 2B, wirebond 246c is electrically and mechanically connecting source 238f of W-phase power switch 208a to PQFN leadframe 260. More particularly, wirebond 246c electrically and mechanically connects source 238f of W-phase power switch 208a to W-phase output pad 222a on PQFN leadframe 260. Thus, W-phase output node 110c of FIG. 1A is situated on W-phase output pad 222a of PQFN leadframe 260 with W-phase power switch 208b. As W-phase power switch 208b is adjacent to W-phase power switch 208a, source 238f of W-phase power switch 208a can be coupled to drain 236a of W-phase power switch 208b while easily avoiding wire shorts due to wire crossing and achieving high electrical and thermal performance. This can be accomplished without utilizing a leadframe strip and/or leadframe island.

Thus, PQFN package 200 can be made significantly smaller while avoiding arcing between U-phase output node 110a, V-phase output node 110b, and W-phase output node 110c. For example, an additional leadframe strip and/or leadframe island would require a larger PQFN package 200 to maintain sufficient spacing 252 between V-phase and U-phase output strips 230 and 232 so as to prevent arcing (e.g. at least 1 mm).

Furthermore, this configuration does not significantly impact flexibility in arranging wirebonds in PQFN package 200. Thus, PQFN package 200 can accommodate, wirebond 244d electrically and mechanically connecting driver IC 202 and source 238f to provide SW3 to driver IC 202 as shown in FIG. 1A. Furthermore, PWFN package 200 can accommodate source 238a of W-phase power switch 208b being connected to W-phase current sense terminal 212v, even where PQFN package 200 has a small footprint. More particularly, in the implementation shown, at least one wirebond 246d is connecting source 238a of W-phase power switch 208b to W-phase current sense terminal 212v. PQFN package 200 thereby provides source 238a for external connection.

Thus, by including U-phase output strip 232 and/or V-phase output strip 230, PQFN package 200 can be made substantially more complex than typical QFN packages while avoiding wire crossing and wire shorting and achieving high electrical and thermal performance. For example, PQFN package 200 can be an open source PQFN package (which may also be referred to as an open emitter PQFN package), in which U-phase motor current $I_{MU}$, V-phase motor current $I_{MV}$, and/or W-phase motor current $I_{MW}$ are provided as respective outputs at U-phase current sense terminal 212t, V-phase current sense terminal 212u, and/or W-phase current sense terminal 212v.

Furthermore, by including U-phase output strip 232 and/or V-phase output strip 230, PQFN package 200 can accommodate a single driver IC 202, for U-phase power switches 204a and 204b, V-phase power switches 206a and 206b, and W-phase power switches 208a and 208b where three discrete driver ICs may otherwise be required to simplify routing. More particularly, U-phase output strip 232 and V-phase output strip 230 afford flexibility in arranging wirebonds connected to driver IC 202. As one example, in the implementation shown, driver IC 202 is connected to U-phase output strip 232 through at least wirebond 244b and to V-phase output strip 224c through at least wirebond 244c. Thus, U-phase output strip 232 and V-phase output strip 230 offer flexibility in positioning of wirebonds 244b and 244c as well as other wirebonds in PQFN package 200.

Thus, as described above with respect to FIGS. 1A, 1B, and 2A through 2D, in accordance with various implementations, PQFN packages can be substantially more complex than typical QFN packages while avoiding wire crossing and wire shorting and achieving high electrical and thermal performance. In doing so, the PQFN packages can achieve complex circuits, such as multi-phase inverter circuits with an open source configuration, which may have a single driver IC.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power quad flat no-lead (PQFN) package comprising:
   U-phase, V-phase, and W-phase power switches situated on a leadframe;
   said U-phase power switch being the only power switch situated on a U-phase output strip of said leadframe;
   a drain of said U-phase power switch being connected to said U-phase output strip of said leadframe;
   wherein said U-phase output strip substantially traverses across said leadframe;
   a source of said U-phase power switch being connected to a U-phase current sense terminal.

2. The (PQFN) package of claim 1, wherein a V-phase output strip substantially traverses across said leadframe.

3. The (PQFN) package of claim 1 comprising a first leadframe island within said U-phase output strip.

4. The (PQFN) package of claim 1 comprising at least one wirebond connected to said U-phase output strip.

5. The (PQFN) package of claim 1 comprising another U-phase power switch situated on said leadframe, a source of said another U-phase power switch connected to said U-phase output strip of said leadframe.

6. The (PQFN) package of claim 1, comprising at least one wirebond connecting said source of said U-phase power switch to said U-phase current sense terminal.

7. The (PQFN) package of claim 1, wherein said U-phase power switch is situated on a U-phase output pad of said leadframe.

8. The (PQFN) package of claim 1 comprising a driver integrated circuit (IC) situated on said leadframe and connected to gates of said U-phase, V-phase, and W-phase power switches.

9. The (PQFN) package of claim 1, wherein said U-phase, V-phase, and W-phase power switches comprise group 111-V transistors.

10. The (PQFN) package of claim 1, wherein said PQFN package has a footprint of greater than 12 mm by 12 mm.

11. The (PQFN) package of claim 1, wherein said PQFN package has a footprint of less than 12 mm by 12 mm.

12. A power quad flat no-lead (PQFN) package comprising:
    U-phase, V-phase, and W-phase power switches situated on a leadframe and respectively connected to a U-phase output strip, a V-phase output strip, and a W-phase output pad of said leadframe;
    said U-phase power switch being the only power switch situated on said U-phase output strip of said leadframe;
    said U-phase output strip, said V-phase output strip, and said W-phase output pad being respectively connected to drains of said U-phase, said V-phase, and said W-phase power switches;
    wherein said U-phase output strip substantially traverses across said leadframe;
    sources of said U-phase, said V-phase, and said W-phase power switches being respectively connected to U-phase, V-phase, and W-phase current sense terminals.

13. The (PQFN) package of claim 12, wherein said V-phase output strip substantially traverses across said leadframe.

14. The (PQFN) package of claim 12 comprising a first leadframe island within said U-phase output strip and a second leadframe island within said V-phase output strip.

15. The (PQFN) package of claim 12, comprising at least one wirebond connecting said source of said V-phase power switch to said V-phase current sense terminal.

16. The (PQFN) package of claim 12 comprising another U-phase power switch and another V-phase power switch situated on said leadframe, a source of said another U-phase power switch connected to said U-phase output strip and a source of said another V-phase power switch connected to said V-phase output strip.

17. The (PQFN) package of claim 12, wherein said U-phase power switch is situated on a U-phase output pad of said leadframe and said V-phase power switch is situated on a V-phase output pad of said leadframe.

18. A power quad flat no-lead (PQFN) package, including a single driver integrated circuit (IC), said PQFN package comprising:
- U-phase, V-phase, and W-phase power switches situated on a leadframe and respectively connected to a U-phase output strip, a V-phase output strip, and a W-phase output pad of said leadframe;
- said U-phase power switch being the only power switch situated on said U-phase output strip of said leadframe;
- said U-phase output strip, said V-phase output strip, and said W-phase output pad being respectively connected to drains of said U-phase, said V-phase, and said W-phase power switches;
- wherein said U-phase output strip substantially traverses across said leadframe;
- sources of said U-phase, said V-phase, and said W-phase power switches being respectively connected to U-phase, V-phase, and W-phase current sense terminals;
- said single driver IC situated on a driver IC pad of said leadframe, said single driver IC being connected to said U-phase output strip and to said V-phase output strip.

19. The (PQFN) package of claim 18, wherein said V-phase output strip substantially traverses across said leadframe.

* * * * *